United States Patent
Matsuo

(10) Patent No.: US 6,525,409 B1
(45) Date of Patent: Feb. 25, 2003

(54) CCD MOLD PACKAGE WITH IMPROVED HEAT RADIATION STRUCTURE

(75) Inventor: Nobuyuki Matsuo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/644,695

(22) Filed: Aug. 24, 2000

(30) Foreign Application Priority Data

Aug. 26, 1999 (JP) .............................................. 11-240075

(51) Int. Cl.⁷ .............................................. H01L 23/495

(52) U.S. Cl. ........................ 257/675; 257/670; 257/692; 257/720

(58) Field of Search ............................... 438/15, 25, 26, 438/51, 55, 60, 64, 67, 71, 74, 75, 106–109, 112, 113, 118, 123–127, 687; 257/210, 660, 666, 670, 675, 678, 690, 692, 704, 720, 787, 793, 796, 676; 206/701, 710, 715; 174/52.5

(56) References Cited

U.S. PATENT DOCUMENTS 5,529,959 A * 6/1996 Yamanaka .................... 438/64
5,977,619 A * 11/1999 Uemua ........................ 257/676
6,274,927 B1 * 8/2001 Glenn ......................... 257/680

FOREIGN PATENT DOCUMENTS

| JP | 6-163950 | 6/1994 |
| JP | 7-86542 | 3/1995 |
| JP | 9-289259 | 11/1997 |
| JP | 10-50970 | 2/1998 |

* cited by examiner

Primary Examiner—Steven Loke
Assistant Examiner—Douglas W. Owens
(74) Attorney, Agent, or Firm—Young & Thompson

(57) ABSTRACT

A heat radiation structure of a mold package for a semiconductor device. The heat radiation structure includes an island of a lead frame having a high heat conductivity for mounting a semiconductor device; outside leads having a high heat conductivity and extending outwardly from the island; and at least a connective region having a high heat conductivity for electrically and thermally connecting the island to the outside leads.

3 Claims, 2 Drawing Sheets

CCD MOLD PACKAGE WITH IMPROVED HEAT RADIATION STRUCTURE

BACKGROUND OF THE INVENTION

The present invention relates to a charge coupled device mold package structure with an improved heat radiation structure, and more particularly to a mold package structure with an improved heat radiation structure for a one-dimensional charge coupled device.

It has been known that as a temperature of the semiconductor device is increased, then a leakage of current of the semiconductor device is also increased. If the charge coupled device is increased in temperature, then the leakage of current of the device is also increased. The increase in the leakage of current causes a dark output. The one-dimensional charge coupled device has a single alignment of many pixels, for example, about 5000 pixels, wherein the single alignment has a first end provided with an amplifier and a second end opposite to the first end. Many photo-receiving transistors are aligned from the first end to the second end of the single alignment of the pixels. Pixels near the amplifier are likely to be increased in temperature. A difference in temperature between the aligned pixels occurs. Namely, non-uniform temperature distribution over the single alignment of the pixels occurs. This non-uniformity in temperature over the single alignment of the pixels causes non-uniformity of the dark output due to the non-uniform leakage currents. Even if the pixel receives no light, then the dark current flows through the pixel so that the pixel is placed in almost the same state as when the pixel receives a light. This results in deterioration in quality of the image generated by the charge coupled device. For the conventional product of 300 DPI (dots per inch), the variation or non-uniformity of the dark output is not much of a problem. However, the advanced charge coupled device of not less than 600 DPI has a strict requirement for suppressing the variation or non-uniformity to the dark output due to the temperature variation over the positions of the aligned pixels. Namely, the advanced charge coupled device of not less than 600 DPI needs a uniform temperature distribution over the positions of the aligned pixels. The conventional mold package for the charge coupled device has less capability of heat radiation. It is necessary for the advanced charge coupled device, particularly the advanced one-dimensional charge coupled device, to develop a novel mold package structure improved in heat radiation capability.

In the above circumstances, it had been required to develop a novel mold package structure with an improved heat radiation structure for an advanced charge coupled device particularly advanced one-dimensional charge coupled device free from the above problems.

SUMMARY OF THE INVENTION

Accordingly, it is an object of the present invention to provide a novel mold package structure with an improved heat radiation structure for an advanced charge coupled device, particularly an advanced one-dimensional charge coupled device, free from the above problems.

It is a further object of the present invention to provide a novel heat radiation structure of a mold package structure for an advanced charge coupled device, particularly an advanced one-dimensional charge coupled device, free from the above problems.

The first present invention provides a heat radiation structure of a mold package for a semiconductor device. The heat radiation structure comprises: an island of a lead frame having a high heat conductivity for mounting a semiconductor device; outside leads having a high heat conductivity and extending outwardly from the island; and at least a connective region having a high heat conductivity for electrically and thermally connecting the island to the outside leads.

The second present invention provides a mold package for a semiconductor device. The mold package comprises: a mold body for sealing a semiconductor device; a lead frame having a high heat conductivity for mounting the semiconductor device; a cap for covering a top opening of the mold body; and a bottom sealing member for sealing a bottom opening of the mold body, wherein the lead frame further has: an island for mounting the semiconductor device; outside leads extending outwardly from the island; and at least a connective region for electrically and thermally connecting the island to the outside leads.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
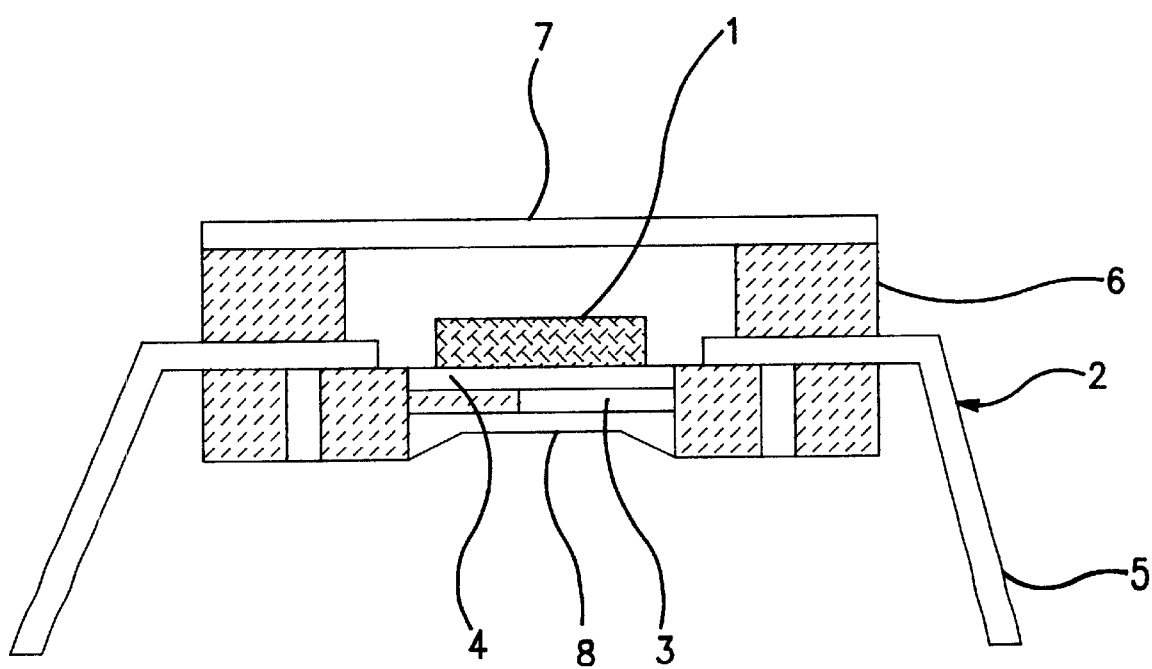
FIG. 1 is a cross sectional elevation view illustrative of a novel mold package structure with an improved heat radiation structure for an advanced charge coupled device in a first embodiment according to the present invention.

The first present invention provides a heat radiation structure of a mold package for a semiconductor device. The heat radiation structure comprises: an island of a lead frame having a high heat conductivity for mounting a semiconductor device; outside leads having a high heat conductivity and extending outwardly from the island; and at least a connective region having a high heat conductivity for electrically and thermally connecting the island to the outside leads.

This heat radiation structure suppresses an excess increase in temperature of the semiconductor device such as the charge coupled device. If the semiconductor chip comprises the charge coupled device, the above improved heat radiation structure of the mold package is particularly effective to ensure the uniformity in temperature distribution of the charge coupled device. Almost no difference in temperature between the pixels aligned in the charge coupled device occurs. Namely, the uniform temperature distribution over the single alignment of the pixels in the charge coupled device occurs. This uniformity in temperature over the single alignment of the pixels causes the uniformity of the dark output. The above novel heat radiation structure of the mold package results in improvement in quality of the image generated by the charge coupled device. For the conventional product of 300 DPI, the variation or non-uniformity of the dark output is not much of a problem. However, the advanced charge coupled device of not less than 600 DPI has a strict requirement for suppressing the variation or non-uniformity to the dark output due to the temperature variation over the positions of the aligned pixels. Namely, the advanced charge coupled device of not less than 600 DPI needs the uniform temperature distribution over the positions of the aligned pixels. The above novel mold package for the charge coupled device has a high capability of heat radiation for realizing a uniform dark output over position, whereby the image obtained by the charge coupled device is greatly improved.

It is preferable that the island has first and second ends opposite to each other and the island is electrically and thermally connected through the at least one connective region to the outside leads. In this case, it is further preferable that some of the outside leads are electrically and thermally connected through a first connective portion of the at least one connective region to a first connective island region positioned near to the first end of the island, whilst remainders of the outside leads are electrically and thermally connected through a second connective portion of the at least one connective region to a second connective island region positioned near to the second end of the island. Alternatively, it is also preferable that some of the outside leads are electrically and thermally connected through a first connective portion of the at least one connective region to the first end of the island, whilst remainders of the outside leads are electrically and thermally connected through a second connective portion of the at least one connective region to the second end of the island.

It is also preferable that the island, the outside leads and the at least one connective region are not less than 5000E-4 Cal/cm sec deg in heat conductivity. In this case, it is further preferable that the island, the outside leads and the at least one connective region are made of a copper alloy.

It is also preferable that the semiconductor device comprises a charge coupled device.

The second present invention provides a mold package for a semiconductor device. The mold package comprises: a mold body for sealing a semiconductor device; a lead frame having a high heat conductivity for mounting the semiconductor device; a cap for covering a top opening of the mold body; and a bottom sealing member for sealing a bottom opening of the mold body, wherein the lead frame further has: an island for mounting the semiconductor device; outside leads extending outwardly from the island; and at least a connective region for electrically and thermally connecting the island to the outside leads.

This heat radiation structure suppresses an excess increase in temperature of the semiconductor device such as the charge coupled device. If the semiconductor chip comprises the charge coupled device, the above improved heat radiation structure of the mold package is particularly effective to ensure the uniformity in temperature distribution of the charge coupled device. Almost no difference in temperature between the pixels aligned in the charge coupled device occurs. Namely, the uniform temperature distribution over the single alignment of the pixels in the charge coupled device occurs. This uniformity in temperature over the single alignment of the pixel causes the uniformity of the dark output. The above novel heat radiation structure of the mold package results in improvement in quality of the image generated by the charge coupled device. For the conventional product of 300 DPI, the variation or non-uniformity of the dark output is not much of a problem. However, the advanced charge coupled device of not less than 600 DPI has a strict requirement for suppressing the variation or non-uniformity to the dark output due to the temperature variation over the positions of the aligned pixels. Namely, the advanced charge coupled device of not less than 600 DPI needs the uniform temperature distribution over the positions of the aligned pixels. The above novel mold package for the charge coupled device has a high capability of heat radiation for realizing a uniform dark output over position, whereby the image obtained by the charge coupled device is greatly improved.

It is preferable that the island has first and second ends opposite to each other and the island is electrically and thermally connected through the at least one connective region to the outside leads. In this case, it is further preferable that some of the outside leads are electrically and thermally connected through a first connective portion of the at least one connective region to a first connective island region positioned near to the first end of the island, whilst remainders of the outside leads are electrically and thermally connected through a second connective portion of the at least one connective region to a second connective island region positioned near to the second end of the island. Alternatively, it is also preferable that some of the outside leads are electrically and thermally connected through a first connective portion of the at least one connective region to the first end of the island, whilst remainders of the outside leads are electrically and thermally connected through a second connective portion of the at least one connective region to the second end of the island.

It is also preferable that the island, the outside leads and the at least one connective region are not less than 5000E-4 Cal/cm sec deg in heat conductivity. In this case, it is further preferable that the island, the outside leads and the at least one connective region are made of a copper alloy.

It is also preferable that the semiconductor device comprises a charge coupled device.

PREFERRED EMBODIMENT

Figure 2:
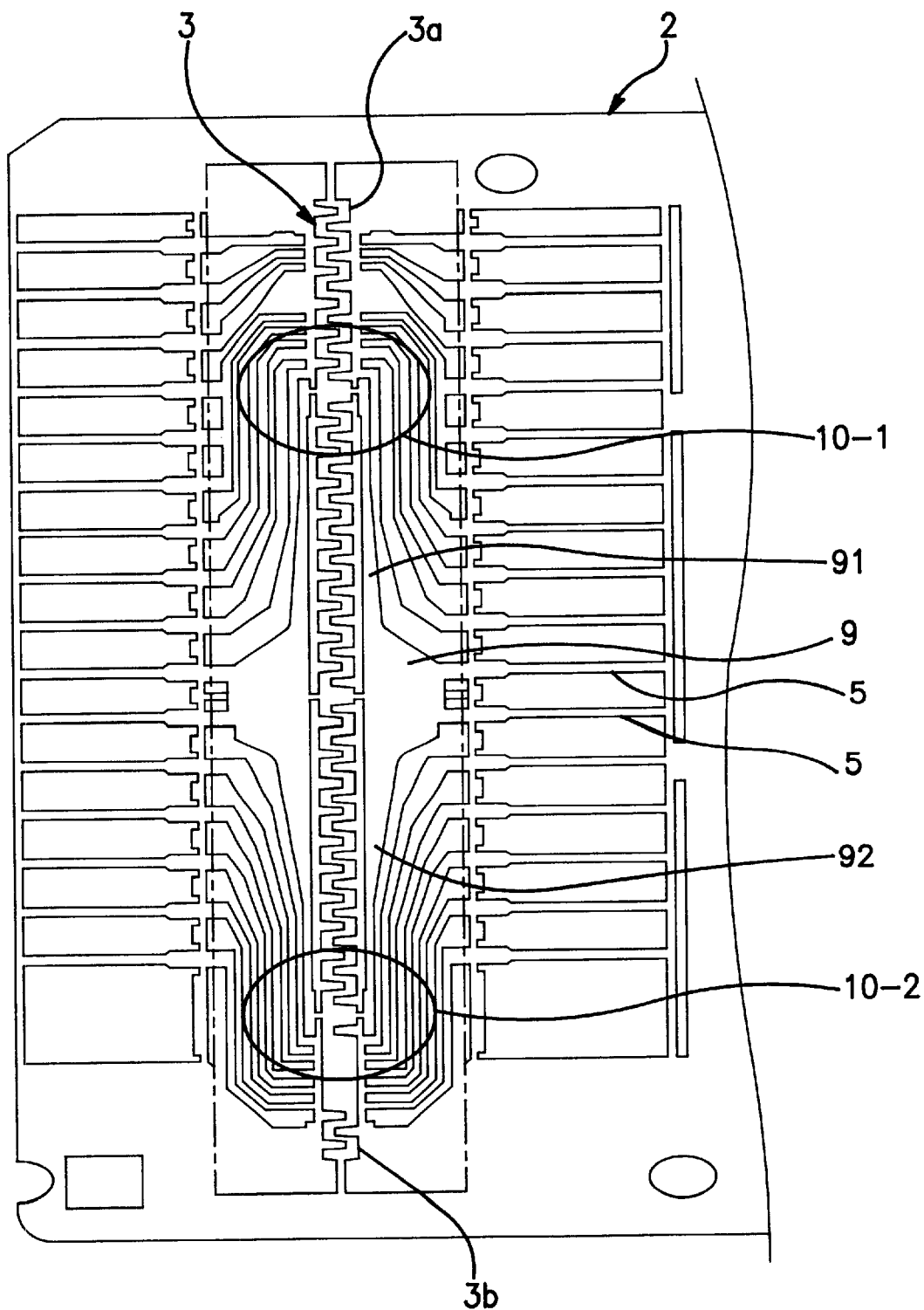
FIG. 2 is a plan view of lead frames of the novel mold package structure with an improved heat radiation structure for an advanced charge coupled device in a first embodiment according to the present invention.

A first embodiment according to the present invention will be described in detail with reference to the drawings. FIG. 1 is a cross sectional elevation view illustrative of a novel mold package structure with an improved heat radiation structure for an advanced charge coupled device in a first embodiment according to the present invention. FIG. 2 is a plan view of lead frames of the novel mold package structure for an advanced charge coupled device in a first embodiment according to the present invention.

The mold package structure with an improved heat radiation structure for an advanced charge coupled device has a mold body 6 for molding a semiconductor chip 1, a lead frame 2 with an island portion 3 for mounting the semiconductor chip 1 on the island portion 3, a mounting member 4 for bonding the island portion 3 to the semiconductor chip 1, and a bottom sealing member 8 for sealing a bottom hole of the mold body 6. The mold body 6, the mounting member 4 and the bottom sealing member 8 are made of highly heat-conductive materials. The lead frame 2 is further provided with outside leads 5 which are not directly connected to the semiconductor chip 1. The island 3 has a first end 3a and a second end 3b opposite to the first end 3a. Some of the outside leads 5 are connected through a first connective portion 91 of a connective region 9 to a first connective island region 10-1 positioned near to the first end 3a of the island 3, whilst remainders of the outside leads 5 are connected through a second connective portion 92 of the connective region 9 to a second connective island region 10-2 positioned near to the second end 3b of the island 3. Namely, the outside leads 5 are connected through the connective region 9 and the island 3 of the lead frame 2 to the semiconductor chip 1.

The semiconductor chip 1 may comprise a charge coupled device, for example, one-dimensional charge coupled device. The lead frame 2 may be made of a copper-alloy. The island 3 is unitary formed with the lead frame 2 and is wave-shaped. The mounting member 4 may comprise an adhesive which adheres the semiconductor chip 1 to the island 3. The outside leads 5 are unitary formed to the lead frame 2. The mold body 6 may be made of a resin material. A cap 7 is further provided on a top portion of the mold body 6 to form an internal space in cooperation with the bottom sealing member 8 in which the semiconductor chip 1 is accommodated. As described above, some of the outside leads 5 are connected through the first connective portion 91 of the connective region 9 to the first connective island region 10-1 positioned near to the first end 3a of the island 3, whilst remainders of the outside leads 5 are connected through the second connective portion 92 of the connective region 9 to the second connective island region 10-2 positioned near to the second end 3b of the island 3.

The lead frame 2 with the island 3 and the outside leads 5 has a first heat conductivity of not less than 5000E-4 Cal/cm sec deg. The mold body 6 has a second heat conductivity in the range of 35E-4 Cal/cm sec deg to 60E-4 Cal/cm sec deg. The mounting member 4 has a third heat conductivity of not less than 30E-4 Cal/cm sec deg. The bottom sealing member 8 has a third heat conductivity of not less than 30E-4 Cal/cm sec deg. The internal structure of the mold package is improved in heat conductivity so as to realize a uniform temperature distribution of the mold package. As described above, some of the outside leads 5 are connected through the first connective portion 91 of the connective region 9 to the first connective island region 10-1 positioned near to the first end 3a of the island 3, whilst remainders of the outside leads 5 are connected through the second connective portion 92 of the connective region 9 to the second connective island region 10-2 positioned near to the second end 3b of the island 3. Namely, the outside leads 5 are electrically and thermally connected through the connective region 9 to the island 3. The connective region 9 of the lead frame 2 also has the first heat conductivity of not less than 5000E-4 Cal/cm sec deg, so that a heat generated by the semiconductor chip 1 is transferred through the island 3 and the connective region 9 of the lead frame 2 to the outside leads 5. Namely, the heat radiation structure comprises the island 3, the connective region 9 and the outside leads 5. This heat radiation structure suppresses an excess increase in temperature of the semiconductor chip 1 such as the charge coupled device.

If the semiconductor chip 1 comprises the charge coupled device, the above improved heat radiation structure of the mold package is particularly effective to ensure the uniformity in temperature distribution of the charge coupled device. Almost no difference in temperature between the pixels aligned in the charge coupled device occurs. Namely, a uniform temperature distribution over the single alignment of the pixels in the charge coupled device occurs. This uniformity in temperature over the single alignment of the pixels causes the uniformity of the dark output. The above novel heat radiation structure of the mold package results in improvement in quality of the image generated by the charge coupled device. For the conventional product of 300 DPI, the variation or non-uniformity of the dark output is not much of a problem. However, the advanced charge coupled device of not less than 600 DPI has a strict requirement for suppressing the variation or non-uniformity to the dark output due to the temperature variation over the positions of the aligned pixels. The above novel mold package for the charge coupled device has a high capability of heat radiation for realizing a uniform dark output over position, whereby the image obtained by the charge coupled device is greatly improved.

In the above embodiment, some of the outside leads 5 are connected through the first connective portion 91 of the connective region 9 to the first connective island region 10-1 positioned near to the first end 3a of the island 3; whilst remainders of the outside leads 5 are connected through the second connective portion 92 of the connective region 9 to the second connective island region 10-2 positioned near to the second end 3b of the island 3. It is, however, possible as a modification that some of the outside leads 5 are connected through the first connective portion 91 of the connective region 9 to the first end 3a of the island 3, whilst remainders of the outside leads 5 are connected through the second connective portion 92 of the connective region 9 to the second end 3b of the island 3. In this modification, this heat radiation structure suppresses an excess increase in temperature of the semiconductor chip 1 such as the charge coupled device. If the semiconductor chip 1 comprises the charge coupled device, the above improved heat radiation structure of the mold package is effective to ensure the uniformity in temperature distribution of the charge coupled device. Almost no difference in temperature between the pixels aligned in the charge coupled device occurs. Namely, a uniform temperature distribution over the single alignment of the pixels in the charge coupled device occurs. This uniformity in temperature over the single alignment of the pixels causes the uniformity of the dark output. The above novel heat radiation structure of the mold package results in improvement in quality of the image generated by the charge coupled device. For the conventional product of 300 DPI, the variation or non-uniformity of the dark output is not much of a problem. However, the advanced charge coupled device of not less than 600 DPI has a strict requirement for suppressing the variation or non-uniformity to the dark output due to the temperature variation over the positions of the aligned pixels. Namely, the advanced charge coupled device of not less than 600 DPI needs the uniform temperature distribution over the positions of the aligned pixels. The above novel mold package for the charge coupled device is greatly improved. The above novel mold package for the charge couple device has a high capability of heat radiation for realizing a uniform dark output over position, whereby the image obtained by the charge coupled device is greatly improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A heat radiation structure of a molded package for a semiconductor device, said heat radiation structure comprising:

an island having a longitudinal axis;
   a plurality of outside leads outwardly extending from said island and orthogonal to said longitudinal axis; and
   at least one intermediate portion electrically and thermally connecting said plurality of outside leads to said island;
      wherein each of said plurality of outside leads connected to said island on a first side of said longitudinal axis are connected via a common intermediate portion, and
      wherein said at least one intermediate portion is connected to said island at a plurality of connection sites.

2. The heat radiation structure of claim 1, further comprising a lead frame, said island having first and second ends along said longitudinal axis connected to said lead frame.

3. The heat radiation structure of claim 1, wherein said island, said plurality of outside leads, and said at least one intermediate portion have a heat conductivity of not less than 5000 E-4 Cal/cm sec ° C. and are structured and arranged to have a uniform temperature distribution.

* * * * *